(12) United States Patent
Mori et al.

(10) Patent No.: US 9,406,585 B2
(45) Date of Patent: Aug. 2, 2016

(54) LIQUID-COOLED-TYPE COOLING DEVICE

(75) Inventors: Shogo Mori, Kariya (JP); Hideyasu Obara, Kariya (JP); Taizo Kuribayashi, Oyama (JP); Shinobu Tamura, Oyama (JP)

(73) Assignees: KABUSHIKI KAISHA TOYOTA JIDOSHOKKI, Kariya-shi (JP); SHOWA DENKO K.K., Tokyo (JP)

( * ) Notice: Subject to any disclaimer, the term of this patent is extended or adjusted under 35 U.S.C. 154(b) by 1803 days.

(21) Appl. No.: 12/546,423

(22) Filed: Aug. 24, 2009

(65) Prior Publication Data

US 2010/0051235 A1 Mar. 4, 2010

(30) Foreign Application Priority Data

Aug. 26, 2008 (JP) ................. 2008-216614

(51) Int. Cl.
*F28F 3/12* (2006.01)
*H01L 23/473* (2006.01)
(Continued)

(52) U.S. Cl.
CPC .......... *H01L 23/473* (2013.01); *H01L 21/4882* (2013.01); *F28F 3/025* (2013.01); *F28F 3/12* (2013.01); *F28F 2265/32* (2013.01); *H01L 2924/0002* (2013.01)

(58) Field of Classification Search
CPC ......... F28F 3/025; F28F 3/12; F28F 2265/32; H01L 21/4882; H01L 23/473; H01L 2924/0002; H01L 2924/00
USPC ........ 165/80.4, 80.5, 104.11, 104.19, 104.21, 165/104.22, 104.23, 104.25, 104.28, 165/104.31, 104.33, 185
See application file for complete search history.

(56) References Cited

U.S. PATENT DOCUMENTS

| 4,478,277 | A |  | 10/1984 | Friedman et al. |
|---|---|---|---|---|
| 6,098,703 | A | * | 8/2000 | Yoshii ........................ 165/153 |
| 6,305,079 | B1 |  | 10/2001 | Child et al. |

(Continued)

FOREIGN PATENT DOCUMENTS

| EP | 1 215 461 A2 | 6/2002 |
|---|---|---|
| EP | 1 215 461 A3 | 6/2002 |

(Continued)

OTHER PUBLICATIONS

U.S. Appl. No. 12/911,357, filed Oct. 25, 2010, Mori, et al.

(Continued)

*Primary Examiner* — Tho V Duong
(74) *Attorney, Agent, or Firm* — Oblon, McClelland, Maier & Neustadt, L.L.P.

(57) ABSTRACT

A liquid-cooled-type cooling device includes a casing which has a cooling-liquid inlet formed at a rear end portion of the casing and a cooling-liquid outlet formed at a front end portion of the casing. A corrugated fin for forming a plurality of flow channels through which a cooling liquid flows from the rear side toward the front side is disposed within the casing to be located between the cooling-liquid inlet and the cooling-liquid outlet. A heat-generating-body mounting region is provided on an outer surface of a top wall of the casing. Projections which come into contact with front and rear portions of the corrugated fin to thereby position the corrugated fin in the front-rear direction are provided on an inner surface of the bottom wall of the casing at positions shifted, in the left-right direction, from an inner surface region corresponding to the heat-generating-body mounting region.

8 Claims, 4 Drawing Sheets

(51) Int. Cl.
*H01L 21/48* (2006.01)
*F28F 3/02* (2006.01)

(56) References Cited

U.S. PATENT DOCUMENTS

| | | | | |
|---|---|---|---|---|
| 6,397,932 | B1 * | 6/2002 | Calaman et al. | 165/80.4 |
| 6,745,823 | B2 * | 6/2004 | Brost | 165/80.4 |
| 6,808,015 | B2 * | 10/2004 | Osakabe | 165/104.25 |
| 6,863,119 | B2 * | 3/2005 | Sugito et al. | 165/104.33 |
| 7,204,299 | B2 * | 4/2007 | Bhatti et al. | 165/104.33 |
| 2006/0219388 | A1 * | 10/2006 | Terakado et al. | 165/80.4 |
| 2007/0039716 | A1 * | 2/2007 | Yeh et al. | 165/80.4 |
| 2009/0065178 | A1 * | 3/2009 | Kasezawa et al. | 165/104.19 |
| 2009/0178792 | A1 | 7/2009 | Mori et al. | |
| 2010/0002397 | A1 | 1/2010 | Toh et al. | |

FOREIGN PATENT DOCUMENTS

| | | |
|---|---|---|
| JP | 10-47879 | 2/1998 |
| JP | 2000-55583 | 2/2000 |
| JP | 2000-105093 | 4/2000 |
| JP | 2001-352025 | 12/2001 |
| JP | 2006-196766 | 7/2006 |
| JP | 2009-105325 | 5/2009 |
| WO | WO 2007/105580 A1 | 9/2007 |

OTHER PUBLICATIONS

U.S. Appl. No. 12/740,024, filed Apr. 27, 2010, Mori, et al.
Extended European Search Report issued Aug. 10, 2010 in EP 09 16 8643.
U.S. Appl. No. 12/546,149, filed Aug. 24, 2009, Mori, et al.

* cited by examiner

LIQUID-COOLED-TYPE COOLING DEVICE

BACKGROUND OF THE INVENTION

The present invention relates to a liquid-cooled-type cooling device for cooling a heat-generating body composed of an electronic component such as a semiconductor device.

In the present specification and appended claims, the side toward which cooling liquid flows within flow channels formed by a fin (the lower side of FIG. 3) will be referred to as "front," and the opposite side will be referred to as "rear." Also, the upper, lower, left-hand, and right-hand sides of FIG. 2 will be referred to as "upper," "lower," "left," and "right," respectively.

There has been conventionally known a liquid-cooled-type cooling device for electronic components (see Japanese Patent Application Laid-Open (kokai) No. 2001-352025). The known liquid-cooled-type cooling device includes a casing which is composed of a top wall, a bottom wall, and a peripheral wall and which has a cooling-liquid inlet formed at a rear end portion of the casing and a cooling-liquid outlet formed at a front end portion of the casing. A fin for forming a plurality of flow channels through which a cooling liquid flows from the rear side toward the front side is disposed within the casing to be located between the cooling-liquid inlet and the cooling-liquid outlet. A portion of the interior of the casing located rearward of the fin serves as an inlet header section which communicates with the cooling-liquid inlet, and a portion of the interior of the casing located frontward of the fin serves as an outlet header section which communicates with the cooling-liquid outlet. A heat-generating-body mounting region is provided on the outer surface of the top wall of the casing and/or the outer surface of the bottom wall of the casing.

However, the liquid-cooled-type cooling device disclosed in the above-mentioned publication has a problem in that the position of the fin may shift in the front-rear direction at the time of manufacture of the cooling device, and, therefore, the fin cannot be accurately disposed at a predetermined position.

SUMMARY OF THE INVENTION

An object of the present invention is to solve the above-mentioned problem and to provide a liquid-cooled-type cooling device which can reliably prevent positional shift of the fin of which shift would otherwise occur when the cooling device is manufactured.

To achieve the above object, the present invention comprises the following modes.

1) A liquid-cooled-type cooling device comprising a casing which has a cooling-liquid inlet formed at a rear end portion of the casing and a cooling-liquid outlet formed at a front end portion of the casing, in which a fin for forming a plurality of flow channels through which a cooling liquid flows from a rear side toward a front side is disposed within the casing to be located between the cooling-liquid inlet and the cooling-liquid outlet, and a heat-generating-body mounting region is provided on an outer surface of a top wall of the casing and/or an outer surface of a bottom wall of the casing, wherein projections which come into contact with front and rear end portions of the fin to thereby position the fin in a front-rear direction are provided on an inner surface of the top wall of the casing and/or an inner surface of the bottom wall of the casing at positions shifted, in a left-right direction, from an inner surface region corresponding to the heat-generating-body mounting region.

2) A liquid-cooled-type cooling device according to par. 1), wherein front-side projections with which the front end portion of the fin comes into contact are provided such that the front-side projections are spaced from one another along the left-right direction; rear-side projections with which the rear end portion of the fin comes into contact are provided such that the rear-side projections are spaced from one another in the left-right direction; and the rear-side projections are shifted from the front-side projections along the left-right direction.

3) A liquid-cooled-type cooling device according to par. 2), wherein, when a length L (mm) of the fin as measured along the front-rear direction is equal to or greater than a width W (mm) of the fin as measured along the left-right direction, the front-side projections and the rear-side projections are provided such that one front-side projection and one rear-side projection are provided at each of left and right end portions of the casing.

4) A liquid-cooled-type cooling device according to par. 2), wherein, when a width W (mm) of the fin as measured along the left-right direction is greater than a length L (mm) of the fin as measured along the front-rear direction, the front-side projections and the rear-side projections are provided such that one front-side projection and one rear-side projection are provided at each of left and right end portions of the casing, and one or more front-side projections and one or more rear-side projections are provided at an intermediate portion of the casing with respect to the left-right direction.

5) A liquid-cooled-type cooling device according to par. 1), wherein the fin is a corrugated fin which includes wave crest portions, wave trough portions, and connection portions connecting the wave crest portions and the wave trough portions; and a width of the front-side projections and the rear-side projections as measured along the left-right direction is less than two times a spacing between two wave crest portions of the fin adjacent to each other and between two wave trough portions thereof adjacent to each other, and is greater than a spacing between a wave crest portion of the fin and a wave trough portion thereof adjacent to the wave crest portion.

6) A liquid-cooled-type cooling device according to par. 5), wherein a height of the front-side projections and the rear-side projections is greater than a thickness of the fin and equal to or less than half a height of the fin.

7) A liquid-cooled-type cooling device according to par. 5), wherein each of the front-side projections and the rear-side projections assumes the form of a circular cone whose diameter decreases toward the tip end thereof.

8) A liquid-cooled-type cooling device according to par. 7), wherein a relation $0<L-L1<D$ is satisfied where L represents a length (mm) of the fin as measured along the front-rear direction; L1 represents a shortest direct distance (mm) between the front-side projections and the rear-side projections; and D represents an outer diameter (mm) of the proximal ends of the front-side projections and the rear-side projections.

According to the liquid-cooled-type cooling device of par. 1), projections which come into contact with front and rear end portions of the fin to thereby position the fin in the front-rear direction are provided on the inner surface of the top wall of the casing and/or the inner surface of the bottom wall of the casing. Thus, positional shift of the fin in the front-rear direction can be prevented during manufacture of the cooling device. Accordingly, the fin can be accurately disposed at a predetermined position. Further, since the projections are provided on the inner surface of the top wall of the casing and/or the inner surface of the bottom wall of the casing at positions shifted, in the left-right direction, from an inner surface region corresponding to the heat-generating-body mounting region, the projections do not decrease the flow velocity of the cooling liquid flowing through flow channels at positions corresponding to the heat-generating-body mounting region, among the flow channels, which are formed by the fin and extend in the front-rear direction, whereby a drop in the effect of cooling the heat-generating body mounted in the heat-generating-body mounting region is prevented.

According to the liquid-cooled-type cooling device of par. 2), the front-side projections with which the front end portion of the fin comes into contact are provided such that they are spaced from one another along the left-right direction; the rear-side projections with which the rear end portion of the fin comes into contact are provided such that they are spaced from one another in the left-right direction; and the rear-side projections are shifted from the front-side projections along the left-right direction. Therefore, it is possible to minimize a drop in the flow velocity of the cooling liquid flowing through flow channels in which the projections are formed, among the flow channels, which are formed by the fin and extend in the front-rear direction.

According to the liquid-cooled-type cooling devices of par. 3) and par. 4), the number of the projections required to prevent positional shift of the fin in the front-rear direction during manufacture of the cooling device can be minimized. Accordingly, it is possible to minimize the drop in the flow velocity of the cooling liquid flowing through flow channels in which the projections are formed, among the flow channels, which are formed by the fin and extend in the front-rear direction.

According to the liquid-cooled-type cooling device of par. 5), the fin is a corrugated fin which includes wave crest portions, wave trough portions, and connection portions connecting the wave crest portions and the wave trough portions; and the width of the front-side projections and the rear-side projections as measured along the left-right direction is less than two times the spacing between two wave crest portions of the fin adjacent to each other and between two wave trough portions thereof adjacent to each other, and is greater than the spacing between a wave crest portion of the fin and a wave trough portion thereof adjacent to the wave crest portion. Therefore, positional shift of the fin in the front-rear direction, which would otherwise occur during manufacture of the cooling device, can be prevented reliably.

According to the liquid-cooled-type cooling device of par. 6), the height of the front-side projections and the rear-side projections is greater than the thickness of the fin and equal to or less than half the height of the fin. Therefore, positional shift of the fin in the front-rear direction, which would otherwise occur during manufacture of the cooling device, can be prevented reliably. In addition, it is possible to minimize the drop in the flow velocity of the cooling liquid flowing through flow channels in which the projections are formed, among the flow channels, which are formed by the fin and extend in the front-rear direction.

According to the liquid-cooled-type cooling device of par. 8), portions of the front-side projections and the rear-side projections bite on the fin, whereby minute play of the fin can be prevented.

DESCRIPTION OF THE PREFERRED EMBODIMENT

Figure 1:
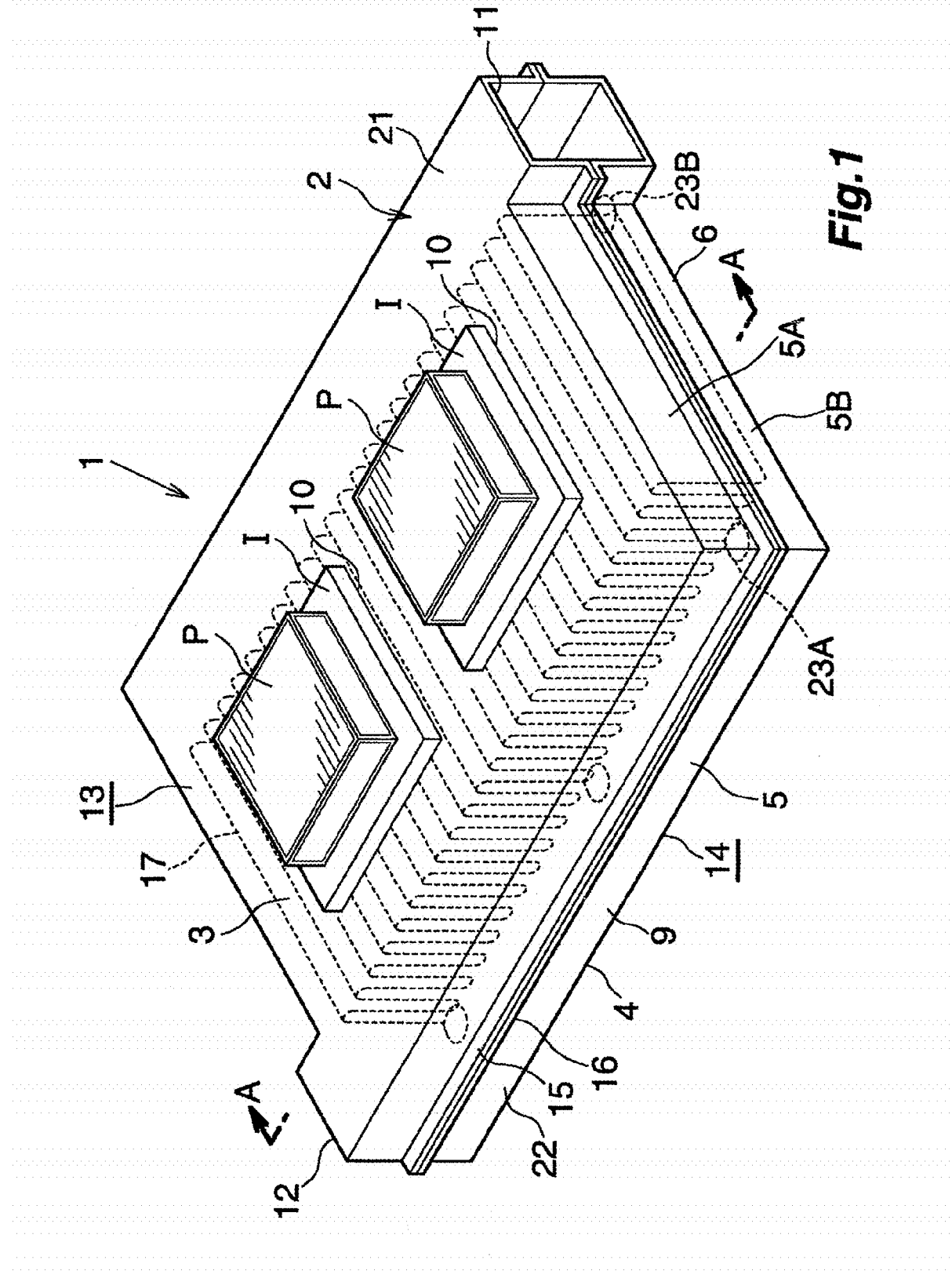
FIG. 1 is a perspective view showing a liquid-cooled-type cooling device according to the present invention.

A preferred embodiment of the present invention will next be described with reference to the drawings.

In the following description, the term "aluminum" encompasses aluminum alloys in addition to pure aluminum.

FIGS. 1 to 4 show a state in which semiconductor devices, each of which is a heat-generating body, are mounted on a liquid-cooled-type cooling device according to the present invention.

In FIGS. 1 to 4, a liquid-cooled-type cooling device 1 has a casing 2 composed of a top wall 3, a bottom wall 4, and a peripheral wall 5. A plurality of heat-generating-body mounting regions 10 are provided on the outer surface of the top wall 3 of the casing 2 such that the regions are separated from one another in the left-right direction. The peripheral wall 5 of the casing 2 includes a right side wall 6, which extends in the front-rear direction and stands vertically; a left side wall 7, which extends in the front-rear direction, stands vertically, and is positioned in opposition to the right side wall 6; a rear side wall 8, which connects rear end portions of the right and left side walls 6 and 7 and stands vertically; and a front side wall 9, which connects front end portions of the right and left side walls 6 and 7 and stands vertically. In the peripheral wall 5 of the casing 2, a cooling-liquid inlet 11 is formed at a rear end portion of the right side wall 6 in a rightward projecting condition, and a cooling-liquid outlet 12 is formed at a front end portion of the left side wall 7 in a leftward projecting condition. The cooling-liquid inlet 11 opens rightward, whereas the cooling-liquid outlet 12 opens leftward. The casing 2 is formed of an upper structure member 13 of aluminum and a lower structure member 14 of aluminum. The upper structure member 13 includes the top wall 3 and an upper peripheral-wall-formation section 5A, which serves as an upper half of the peripheral wall 5. The lower structure member 14 includes the bottom wall 4 and a lower peripheral-wall-formation section 5B, which serves as a lower half of the peripheral wall 5. A lower end portion of the upper peripheral-wall-formation section 5A of the upper structure member 13 and an upper end portion of the lower peripheral-wall-formation section 5B of the lower structure member 14 have integrally formed outward flanges 15 and 16, respectively. The outward flanges 15 and 16 of the upper and lower structure members 13 and 14 are brazed together. Each of the upper structure member 13 and the lower structure member 14 is formed from an aluminum blank plate through press working.

An aluminum corrugated fin 17 is disposed in an internal region of the casing 2 located between the right side wall 6 and the left side wall 7 and between the cooling-liquid inlet 11 and the cooling-liquid outlet 12. The corrugated fin 17 includes wave crest portions 17a extending in the front-rear direction, wave trough portions 17b extending in the front-rear direction, and vertical connection portions 17c connecting the respective wave crest portions 17a and wave trough portions 17b. The wave crest portions 17a are brazed to the top wall 3 of the casing 2, whereas the wave trough portions 17b are brazed to the bottom wall 4 of the casing 2. The corrugated fin 17 forms a plurality of flow channels 18 which extend in the front-rear direction and are arranged in the left-right direction and through which cooling liquid flows from the rear side toward the front side, thereby providing a parallel-flow-channel section 19 including a plurality of flow channels.

A portion of the interior of the casing 2 located upstream (rearward) of the parallel-flow-channel section 19 serves as an inlet header section 21 communicating with the cooling-liquid inlet 11. A portion of the interior of the casing 2 located downstream (frontward) of the parallel-flow-channel section 19 serves as an outlet header section 22 communicating with the cooling-liquid outlet 12. The internal height of the entire casing 2 is uniform; i.e., the inlet header section 21, the outlet header section 22, and the parallel-flow-channel section 19 have the same height. The rear side wall 8 and the front side wall 9 of the casing 2 extend perpendicular to the right side wall 6 and the left side wall 7.

Projections 23A and 23B are provided on the inner surface of the bottom wall 4 of the casing 2 at positions shifted, in the left-right direction, from inner surface regions corresponding to the heat-generating-body mounting regions 10. The projections 23A and 23B come into contact with front and rear end portions of the corrugated fin 17 so as to position the corrugated fin 17 with respect to the front-rear direction. The projections 23A and 23B are formed by means of deforming the bottom wall 4 when the lower structure member 14 is formed through press working, and assume the form of a circular cone whose diameter decreases toward the tip end thereof. The front-side projections 23A, with which the front end portion of the corrugated fin 17 comes into contact, are provided such that they are separated from one another in the left-right direction. Similarly, the rear-side projections 23B, with which the rear end portion of the corrugated fin 17 comes into contact, are provided such that they are separated from one another in the left-right direction. The rear-side projections 23B are shifted from the front-side projections 23A along the left-right direction. The front-side projections 23A are respectively formed at a position located at the left end portion of the casing 2, a position shifted slightly leftward from the center of the casing 2 with respect to the left-right direction, and a position near the right end portion of the casing 2. The rear-side projections 23B are respectively formed at a position located at the right end portion of the casing 2, a position shifted slightly rightward from the center of the casing 2 with respect to the left-right direction, and a position near the left end portion of the casing 2.

In the case where the length L (mm) of the corrugated fin 17 as measured along the front-rear direction is equal to or greater than the width W (mm) of the corrugated fin 17 as measured along the left-right direction, preferably, the front-side projections 23A and the rear-side projections 23B are provided such that at least one front-side projection 23A and one rear-side projection 23B are provided at each of the left and right end portions of the casing 2. In the case where the width W (mm) of the corrugated fin 17 as measured along the left-right direction is greater than the length L (mm) of the corrugated fin 17 as measured along the front-rear direction, preferably, the front-side projections 23A and the rear-side projections 23B are provided such that one front-side projection 23A and one rear-side projection 23B are provided at each of the left and right end portions of the casing 2, and one or more front-side projections 23A and one or more rear-side projections 23B are provided at an intermediate portion of the casing 2 with respect to the left-right direction.

Figure 2:
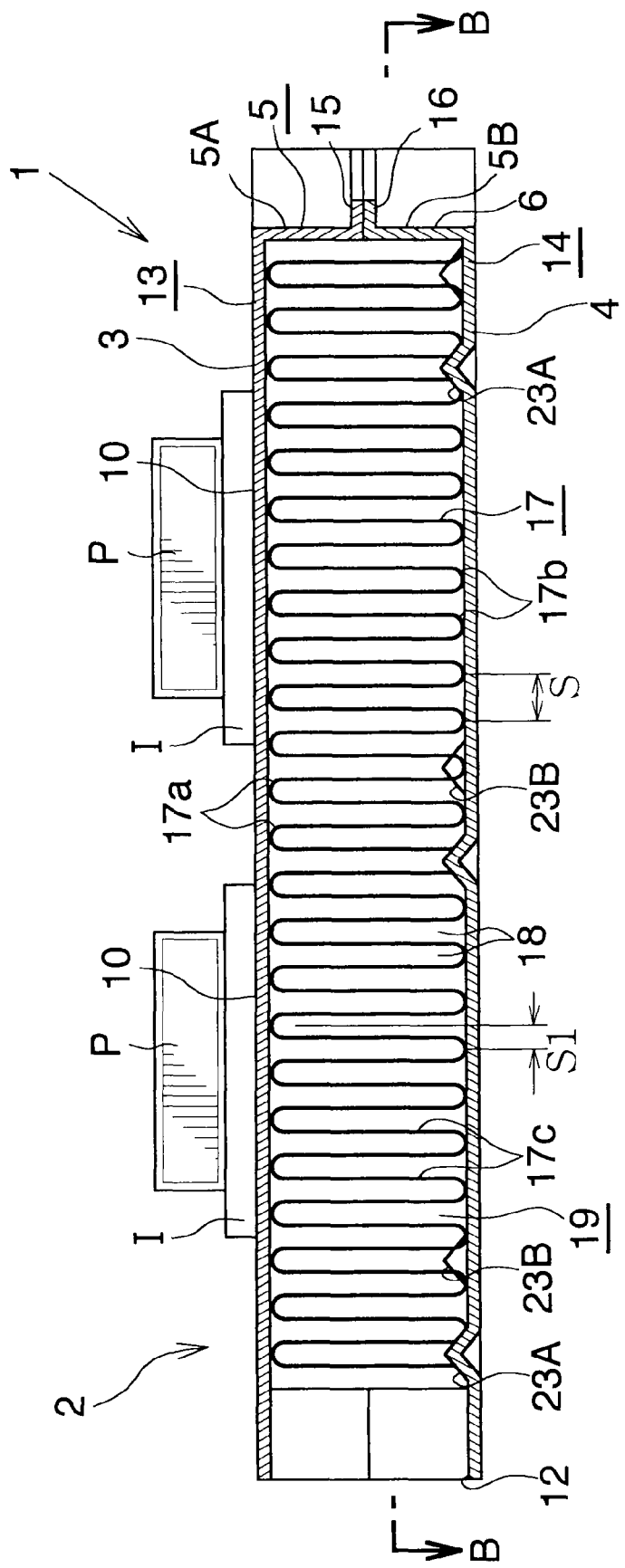
FIG. 2 is a sectional view taken along line A-A of FIG. 1.
Figure 3:
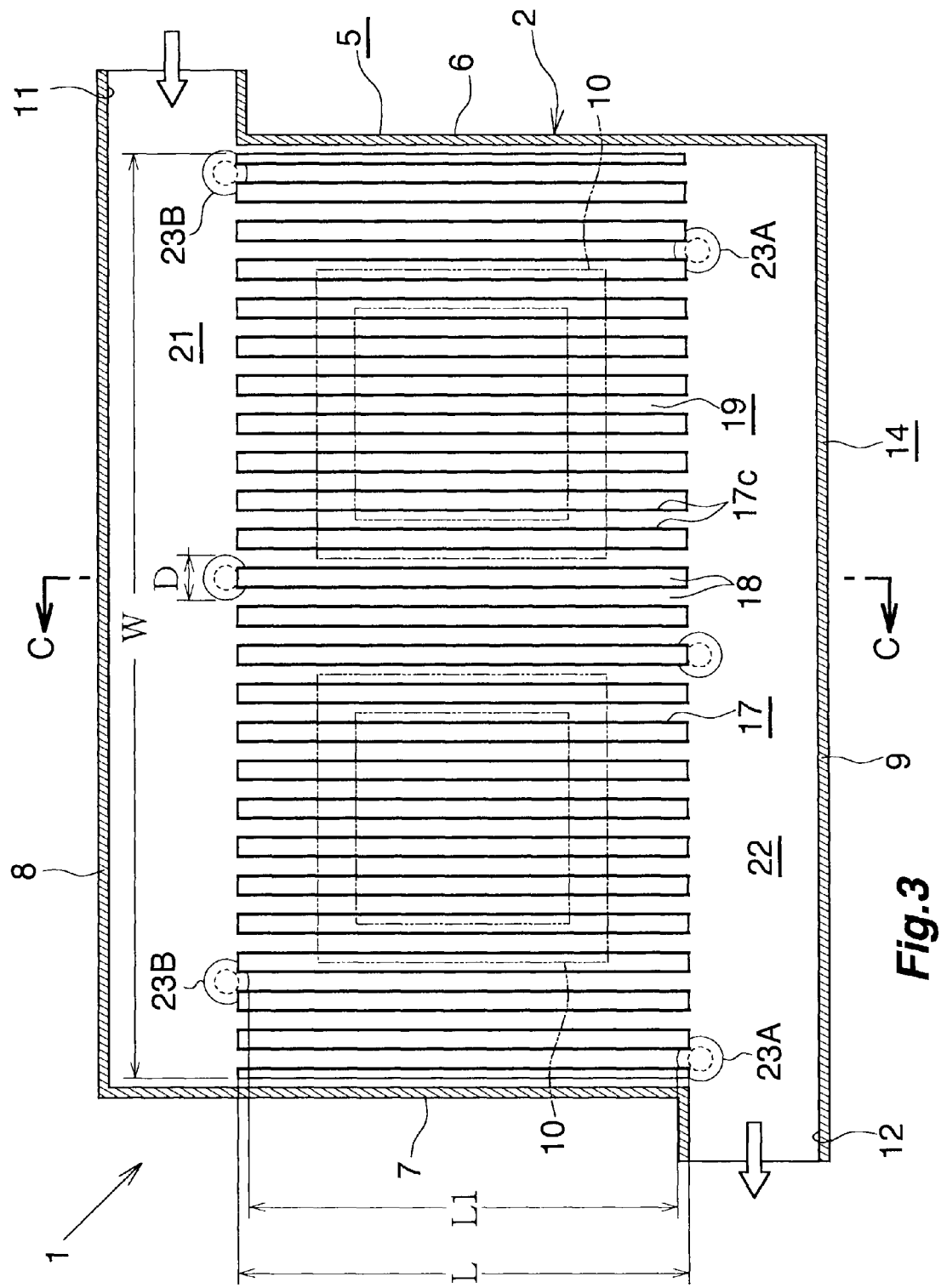
FIG. 3 is a sectional view taken along line B-B of FIG. 2.
Figure 4:
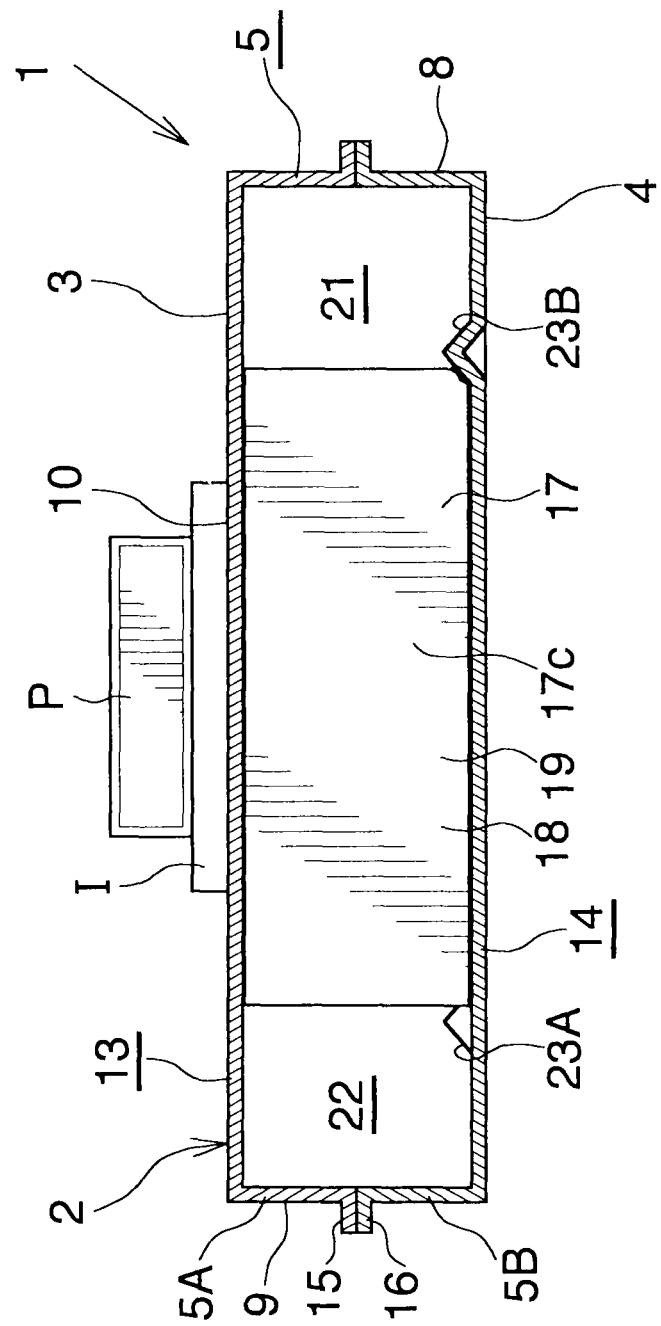
FIG. 4 is a sectional view taken along line C-C of FIG. 3.

Preferably, the width of the front-side projections 23A and the rear-side projections 23B as measured along the left-right direction; i.e., the outer diameter D (mm) of the proximal end of each projection, is less than two times a spacing S (mm) between two wave crest portions 17a of the corrugated fin 17 adjacent to each other and between two wave trough portions 17b thereof adjacent to each other, and is greater than a spacing S1 (mm) between a wave crest portion 17a of the corrugated fin 17 and a wave trough portion 17b thereof adjacent to the wave crest portion 17a (see FIGS. 2 and 3). Further, preferably, the height of the front-side projections 23A and the rear-side projections 23B is greater than the thickness of the corrugated fin 17 and equal to or less than half the height of the corrugated fin 17. Further, preferably, a relation $0<L-L1<D$ is satisfied where L represents the length (mm) of the corrugated fin 17 as measured along the front-rear direction; L1 represents the shortest direct distance (mm) between the front-side projections 23A and the rear-side projections 23B; and D represents the outer diameter (mm) of the proximal ends of the front-side projections 23A and the rear-side projections 23B (see FIG. 3).

Semiconductor devices P, each of which is a heat-generating body, are joined to the outer surface of the top wall 3 of the casing 2 via plate-shaped insulating members I to be located in the heat-generating-body mounting regions 10.

In the liquid-cooled-type cooling device 1 having the above-described configuration, a cooling liquid having flowed into the inlet header section 21 through the cooling-liquid inlet 11 flows into all of the flow channels 18 of the parallel-flow-channel section 19 in a uniformly divided condition, and flows frontward through the flow channels 18.

The cooling liquid having flowed frontward through the flow channels 18 of the parallel-flow-channel section 19 enters the outlet header section 22, flows leftward through the outlet header section 22, and flows out of the casing 2 via the cooling-liquid outlet 12.

Heat generated from the semiconductor devices P is transmitted to the cooling liquid which flows through the flow channels 18, via the insulating members I, the top wall 3 of the casing 2, and the corrugated fin 17. The semiconductor devices P are thus cooled.

Since the front-side projections 23A and the rear-side projections 23B are provided on the inner surface of the bottom wall 4 of the casing 2 at positions shifted, in the left-right direction, from inner surface regions corresponding to the heat-generating-body mounting regions 10, the projections do not decrease the flow velocity of the cooling liquid flowing through flow channels 18 corresponding to the heat-generating-body mounting regions 10, among all the flow channels 18, which are formed by the corrugated fin 17 and extend in the front-rear direction, whereby a drop in the effect of cooling the heat-generating bodies P mounted in the heat-generating-body mounting regions 10 is prevented. Further, since the rear-side projections 23B are shifted from the front-side projections 23A along the left-right direction, it is possible to minimize a drop in the flow velocity of the cooling liquid flowing through flow channels 18 in which the front-side projections 23A and the rear-side projections 23B are formed, among all the flow channels 18, which are formed by the corrugated fin 17 and extend in the front-rear direction. Moreover, since the height of the front-side projections 23A and the rear-side projections 23B is greater than the thickness of the corrugated fin 17 and equal to or less than half the height of the corrugated fin 17, it is possible to minimize the drop in the flow velocity of the cooling liquid flowing through flow channels 18 in which the projections 23A and 23B are formed, among all the flow channels 18, which are formed by the corrugated fin 17 and extend in the front-rear direction.

In the above-described embodiment, the projections 23A and 23B are provided on the inner surface of the bottom wall 4 of the casing 2; however, the surface on which the projections 23A and 23B are provided is not limited thereto, and the projections may be provided on the inner surface of the top wall 3. Alternatively, the projections may be provided on both the inner surface of the top wall 3 and the inner surface of the bottom wall 4. In the case where the projections are provided on both the inner surface of the top wall 3 and the inner surface of the bottom wall 4, the front-side projections on the inner surface of the top wall 3 are shifted from the rear-side projections on the inner surface of the top wall 3 along the left-right direction, and the front-side projections on the inner surface of the bottom wall 4 are shifted from the rear-side projections on the inner surface of the bottom wall 4 along the left-right direction. Further, the front-side projections on the inner surface of the top wall 3 are shifted from the front-side projections on the inner surface of the bottom wall 4 along the left-right direction, the rear-side projections on the inner surface of the top wall 3 are shifted from the rear-side projections on the inner surface of the bottom wall 4 along the left-right direction, the front-side projections on the inner surface of the top wall 3 are shifted from the rear-side projections on the inner surface of the bottom wall 4 along the left-right direction, and the rear-side projections on the inner surface of the top wall 3 are shifted from the front-side projections on the inner surface of the bottom wall 4 along the left-right direction.

What is claimed is:

1. A liquid-cooled-type cooling device comprising:
   a casing which has a cooling-liquid inlet formed at a rear end portion of the casing and a cooling-liquid outlet formed at a front end portion of the casing that is opposite to the rear end portion;
   a fin for forming a plurality of flow channels through which a cooling liquid flows from a rear side defined by the rear end portion toward a front side defined by the front end portion, the fin being disposed within the casing to be located between the cooling-liquid inlet and the cooling-liquid outlet;
   a heat-generating-body mounting region provided on an outer surface of a top wall of the casing and/or an outer surface of a bottom wall of the casing; and
   projections which come into contact with front and rear end portions of the fin to thereby position the fin in a front-rear direction, the projections being provided on an inner surface of the top wall of the casing and/or an inner surface of the bottom wall of the casing at positions shifted in a left-right direction along the rear end portion and front end portion of the fin such that the projections are provided outside an inner surface region corresponding to the heat-generating-body mounting region.

2. A liquid-cooled-type cooling device according to claim 1, wherein:
   front-side projections with which the front end portion of the fin comes into contact are provided such that the front-side projections are spaced from one another along the left-right direction;
   rear-side projections with which the rear end portion of the fin comes into contact are provided such that the rear-side projections are spaced from one another in the left-right direction; and
   the rear-side projections are shifted from the front-side projections along the left-right direction.

3. A liquid-cooled-type cooling device according to claim 2, wherein:
   when a length L (mm) of the fin as measured along the front-rear direction is equal to or greater than a width W (mm) of the fin as measured along the left-right direction, the front-side projections and the rear-side projections are provided such that one front-side projection and one rear-side projection are provided at each of left and right end portions of the casing.

4. A liquid-cooled-type cooling device according to claim 2, wherein,
   when a width W (mm) of the fin as measured along the left-right direction is greater than a length L (mm) of the fin as measured along the front-rear direction, the front-side projections and the rear-side projections are provided such that one front-side projection and one rear-side projection are provided at each of left and right end portions of the casing, and one or more front-side projections and one or more rear-side projections are provided at an intermediate portion of the casing with respect to the left-right direction.

5. A liquid-cooled-type cooling device according to claim 1, wherein:
   the fin is a corrugated fin which includes wave crest portions, wave trough portions, and connection portions connecting the wave crest portions and the wave trough portions; and
   the projections include front-side projections and rear-side projections whose widths as measured along the left-right direction are less than two times a spacing between two wave crest portions of the fin adjacent to each other and between two wave trough portions thereof adjacent to each other, and are greater than a spacing between a wave crest portion of the fin and a wave trough portion thereof adjacent to the wave crest portion.

6. A liquid-cooled-type cooling device according to claim 5, wherein a height of the front-side projections and a height of the rear-side projections are greater than a thickness of the fin and equal to or less than half of a height of the fin.

7. A liquid-cooled-type cooling device according to claim 5, wherein each of the front-side projections and the rear-side projections is of a circular cone form whose diameter decreases toward the tip end thereof.

8. A liquid-cooled-type cooling device according to claim 7, wherein:
   a relation $0<L-L1<D$ is satisfied where L represents a length (mm) of the fin as measured along the front-rear direction;
   L1 represents a shortest direct distance (mm) between the front-side projections and the rear-side projections; and
   D represents an outer diameter (mm) of the proximal ends of the front-side projections and the rear-side projections.

* * * * *